(12) United States Patent
Wang et al.

(10) Patent No.: US 6,211,058 B1
(45) Date of Patent: Apr. 3, 2001

(54) SEMICONDUCTOR DEVICE WITH MULTIPLE CONTACT SIZES

(75) Inventors: John Jianshi Wang, San Jose; Hao Fang, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/353,781

(22) Filed: Jul. 15, 1999

Related U.S. Application Data

(62) Division of application No. 08/991,052, filed on Dec. 16, 1997, now Pat. No. 5,994,780.

(51) Int. Cl.$^7$ .................................................. H01L 21/4763
(52) U.S. Cl. ............................................ 438/620; 438/911
(58) Field of Search ..................................... 438/620, 911

(56) References Cited

U.S. PATENT DOCUMENTS

| | | | |
|---|---|---|---|
| 5,177,592 | * | 1/1993 | Takahashi et al. ............ 257/758 |
| 5,317,193 | | 5/1994 | Watanabe ..................... 257/773 |
| 5,521,409 | | 5/1996 | Shieh et al. .................. 257/773 |
| 5,712,509 | * | 1/1998 | Harada et al. ................ 257/758 |
| 5,760,429 | | 6/1998 | Yano et al. ................... 257/773 |
| 5,856,706 | * | 1/1999 | Lee ............................. 257/758 |

FOREIGN PATENT DOCUMENTS

| | | |
|---|---|---|
| 59-76468 | 5/1984 | (JP) . |
| 60-117771 | 6/1985 | (JP) . |

\* cited by examiner

Primary Examiner—John F. Niebling
Assistant Examiner—David A. Zarneke
(74) Attorney, Agent, or Firm—Foley & Lardner

(57) ABSTRACT

A semiconductor device having multiple layers uses different size contacts at different layer in order in order to simply the manufacturing process and the depth of etching required. Contact sizes are selected based on the responsiveness of the material to the etching process. Where a deep etch is required, a larger contact is used. A shallower etch through similar material uses a smaller contact to slow the etching process. As a result, the etches can complete at about the same time. The technique can be employed to etch any number of contacts. An intermediate size contact can be used where the material to be etched results in a slower etching process. A plurality of contact sizes can be used depending on the depths of etching required and the characteristics material to be etched, so that the etching for all the contacts completes at substantially the same time.

3 Claims, 2 Drawing Sheets

250
SEMICONDUCTOR DEVICE WITH MULTIPLE CONTACT SIZES

This application is a Divisional of application Ser. No. 08/991,052, filed Dec. 16, 1997 now U.S. Pat. No. 5,994,780.

BACKGROUND OF THE INVENTION

1. Field of the Invention

The invention relates to semiconductor devices and methods for construction thereof. In particular, the invention relates to using different contact sizes at different layers of the semiconductor device in order to simplify and improve manufacturing techniques.

2. Related Art

In building semiconductor devices, such as NAND gates or other logic gates, it is necessary to make contact with various layers of the semiconductor device. This includes making contact with the first or second polysilicon layers or the silicon core. FIG. 1 is an example of one such device. As shown in FIG. 1, a silicon core 101 has overlaid thereon a first polysilicon layer 103 which stores electrons. An oxide layer 102 can also be used between the silicon core 101 and the first polysilicon layer 103. Polysilicon layer 103 is covered by a dielectric layer 105. Dielectric Layer 105 is typically made up of an oxide layer 107, a nitride layer 109 and another oxide layer 110. Dielectric layer 105 has a second polysilicon layer 111 thereon. This layer often serves as the gate or word line where voltage is applied to turn on selected cells. The second polysilicon layer 111 also has thereon a tungsten silicide layer 113. These layers are covered by an interlayer dielectric (ILD) 115, which is polished to a uniform thickness. Metal interconnection lines 117 are then formed on top of the ILD 115.

FIG. 1 also illustrates contact 119 contacting the core layer, contact 121 contacting the P1 layer, and contact 123 contacting the P2 layer. In conventional semiconductor devices, each of these contacts is the same size. Although each contact is the same size, it is necessary to etch different amounts of material to achieve the contacts at the different depths shown in FIG. 1. For example, where the pattern is manufactured into each layer and the ILD material subsequently applied, the ILD must be etched away to a different depth for contacts 119, 121 and 123. Conventional systems attempt to achieve the uniform contact size by adjusting etch process parameters, such as chamber pressure, temperature or other parameters. This approach results in a complex manufacturing process, which is subject to error in etching to the correct depth.

SUMMARY AND OBJECTS OF THE INVENTION

It is an object of the invention to improve manufacturing techniques for semiconductor devices.

It is still another object of the invention to reduce the complexity of the etching process and to provide a simplified technique for manufacturing semiconductor devices, in particular, logic gates and further in particular, NAND gates.

It is a still further object of the invention to provide a semiconductor device with more accurately etched contacts.

It is a still further object of the invention to provide an improved process for forming contacts in semiconductor devices.

The above and other objects of the invention are accomplished in a semiconductor device which has a core region, a first polysilicon region or P1 region, and a second polysilicon region or P2 region. The semiconductor device according to the invention also has a plurality of contacts. Contacts to the P1 region are different in size from the contacts in the core region. According to another aspect of the invention, contacts in the P2 region are different in size from the contacts in the core region. In another aspect of the invention, contacts in the P1 and P2 regions are different in size from each other. In a further aspect of the invention, the size of the contacts in the P1, P2 and core regions are all different.

According to the invention, contacts to the P1 region are smaller than the contacts to the core region. In another aspect of the invention, contacts in the P2 region are smaller than contacts in the core region. In still another aspect of the invention, contacts in the P1 region are smaller than the contacts in the P2 region. According to another aspect of the invention, contacts in the P1 region are smaller than contacts in the P2 region which are smaller than contacts to the core region. One type device employing such a structure is a logic gate, and in particular, a NAND gate.

BRIEF DESCRIPTION OF THE DRAWINGS

The above and other objects of the invention are detailed in the following specification with reference to the drawings in which.

DETAILED DESCRIPTION OF THE PREFERRED EMBODIMENTS

Figure 1:
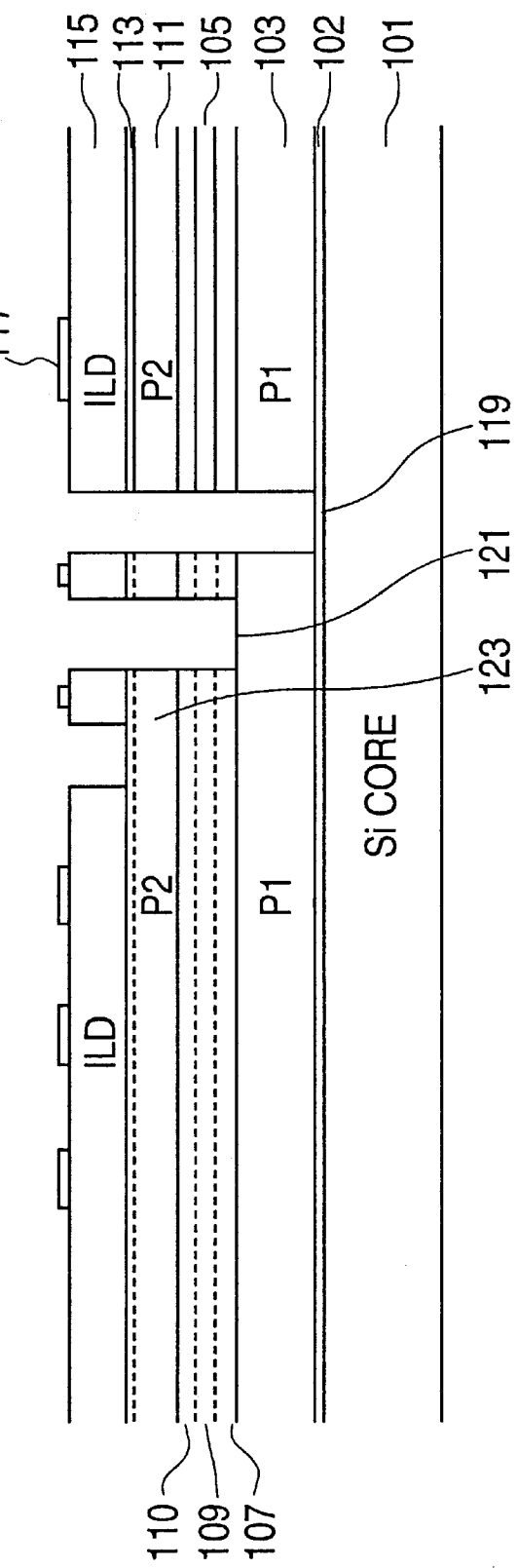
FIG. 1 shows a structure of a semiconductor device in which the P1, P2 and core contacts are the same size.

In forming contacts in semiconductor devices, such as logic gates, including NAND gates, core contacts are the most difficult to make effectively. Typically, a photoresist is used to make a pattern on the ILD 115. The ILD 115 thickness varies because of the topography underneath it. The topography differs because in some cases it is necessary to contact the silicon core 101, while in other cases it is necessary to contact the first polysilicon layer P1 or the second polysilicon layer P2. In order make the required contacts, it is necessary to etch through the ILD and possibly other layers. Core contacts are difficult to make because of the thicker ILD which must be etched in this area.

Conventional semiconductor devices having uniform contact sizes require sophisticated etching processes because the core contact 119 is deeper than the P1 contact 121 or the P2 contact 123. Ideally, the contact to the P1 layer would be at the surface of P1 layer 103 without etching any of the P1 layer itself away. Silicon core 101 is often a high density memory cell and contact the surface of the silicon core is necessary in order to select that cell. As a result, it is useful for the contact 119 to be relatively large. On the other hand, it is desirable for the P1 contact to stop at the surface of the polysilicon layer 103 in order to preserve the P1 layer and avoid leakage. Where the contact size is the same, etching must be controlled by adjusting etch process parameters, such as chamber pressure, in order to achieve contact at the desired location.

Figure 2:
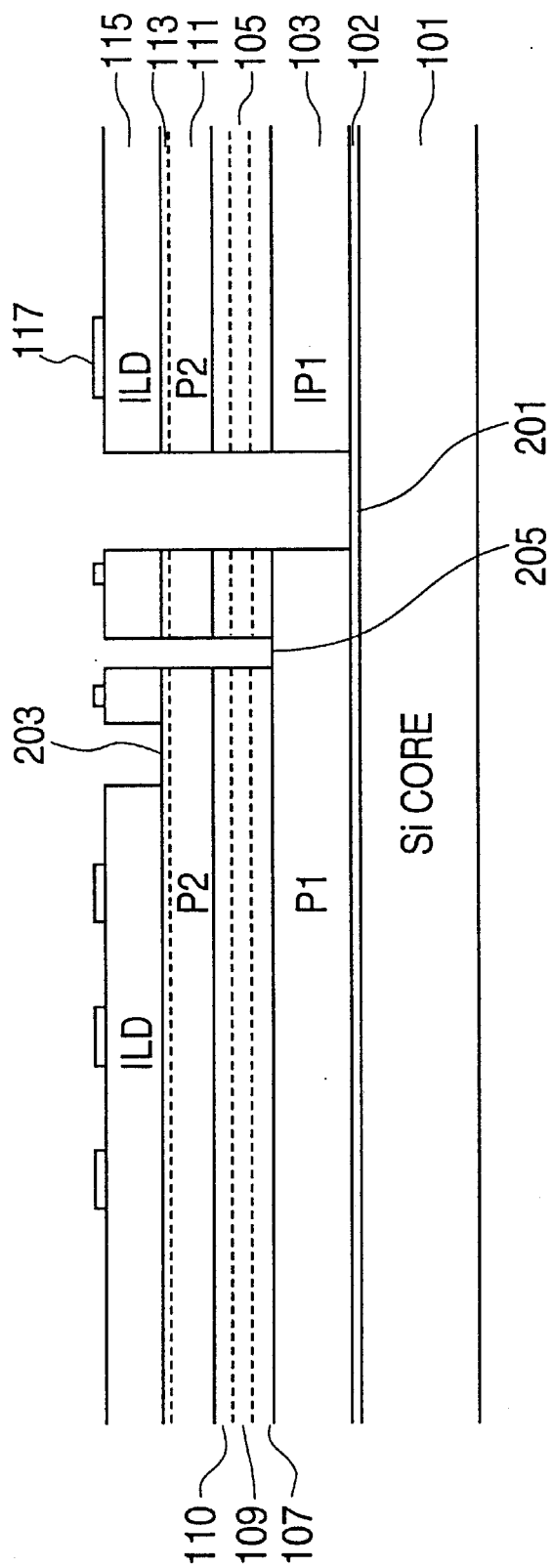
FIG. 2 shows a structure of a semiconductor device according to the invention in which the P1, P2 and core contacts are different sizes.

According to the invention, it is possible to take advantage of microloading effects to reduce the reliance on complex adjustment of etch process parameters. FIG. 2 illustrates a semiconductor device in which the core contact 201 is larger than the P2 contact 203 or the P1 contact 205. In addition, the P2 contact 203 is larger than P1 contact 205. By modifying the contact size to accommodate the etch rate, the invention allows etching to take about the same amount of time for each of the contacts 201, 203 and 205 under relatively constant etch process conditions.

The invention takes advantage of microloading effects which occur during the etch process. In microloading, as the etch progresses, polymer builds up on the bottom of the etched area. This slows the etching process. The effect is particularly pronounced with smaller contacts because the polymer buildup on the bottom of the etch takes longer to remove. Thus, the required etching time depends on the contact size. According to the invention, the core contact is made larger to etch the area faster and build up less polymer. In contrast, the P1 contact is made smaller to slow the etch process in this area and avoid punching through to the P1 layer. The P2 contact is less sensitive to the etching process because of the construction of the semiconductor device. In particular, the P2 layer contact is made on tungsten silicide layer 113. The etching takes longer because the etch rate is slow on tungsten silicide.

By selecting the size of the contacts, the etch process can take place over a relatively constant period of time, so that all contacts are made without the need for significant manipulation of etch process parameters. Thus, the different contact sizes permit the etching for each of the contacts to take about the same amount of time. This simplifies the manufacturing process.

In NAND gate production, experimental results indicate that a P2 contact of 0.36 microns, a P1 contact of 0.32 microns and a core contact of 0.40 microns produces good results, avoiding punch-through at the P1 contact and under-etching of the core contact.

While specific embodiments of the invention have been described and illustrated, it will be clear that variations in the details of the embodiments specifically illustrated and described may be made without departing from the true spirit and scope of the invention as defined in the appended claims.

What is claimed is:

1. A method of forming semiconductor devices comprising:
    a) providing a core region;
    b) forming a p1 region on said core region;
    c) forming a p2 region on said p1 region;
    d) forming a plurality of contacts, said ones of said contacts to said p1 region being a different size from ones of said contacts to said core region,
        wherein said ones of said contacts to said p1 region are smaller than said ones of said contacts to said core region, and
    e) wherein said ones of said contacts to said p1 region are smaller than ones of said contacts to said p2 region.

2. A method as recited in claim 1, wherein said semiconductor device includes a NAND gate.

3. A method as recited in claims 1, wherein a first of said contacts is to a p1 region, a second of said contacts is to a p2 region, and a third of said contacts is to a core region.

* * * * *